US012627038B2

(12) United States Patent
Ptak et al.

(10) Patent No.: US 12,627,038 B2
(45) Date of Patent: May 12, 2026

(54) ELECTRONIC DEVICE

(71) Applicants: STMicroelectronics (Grenoble 2) SAS, Grenoble (FR); STMicroelectronics (Alps) SAS, Grenoble (FR)

(72) Inventors: Olivier Ptak, Pontcharra (FR); Ouafa Hajji, Voiron (FR); Georg Kimmich, Saint-Marcellin (FR)

(73) Assignees: STMicroeletronics (Grenoble 2) SAS, Grenoble (FR); STMicroeletronics (Alps) SAS, Grenoble (FR)

( * ) Notice: Subject to any disclaimer, the term of this patent is extended or adjusted under 35 U.S.C. 154(b) by 214 days.

(21) Appl. No.: 18/194,855

(22) Filed: Apr. 3, 2023

(65) Prior Publication Data

US 2023/0318171 A1     Oct. 5, 2023

(30) Foreign Application Priority Data

Apr. 5, 2022   (FR) ...................................... 2203116

(51) Int. Cl.
| | |
|---|---|
| *H01Q 1/40* | (2006.01) |
| *H01Q 1/22* | (2006.01) |
| *H01Q 1/48* | (2006.01) |
| *H01Q 9/04* | (2006.01) |
| *H05K 3/10* | (2006.01) |
| *H05K 3/28* | (2006.01) |

(52) U.S. Cl.
CPC ................. *H01Q 1/40* (2013.01); *H01Q 1/22* (2013.01); *H01Q 1/48* (2013.01); *H01Q 9/0407* (2013.01); *H05K 3/107* (2013.01); *H05K 3/28* (2013.01)

(58) Field of Classification Search
None
See application file for complete search history.

(56) References Cited

U.S. PATENT DOCUMENTS

| | | | |
|---|---|---|---|
| 9,881,882 B2 * | 1/2018 | Hsu .......................... | H01L 23/66 |
| 2006/0157568 A1 * | 7/2006 | Ato ...................... | G06K 7/0008 235/451 |
| 2009/0322643 A1 * | 12/2009 | Choudhury ........ | H01Q 21/0025 343/851 |
| 2013/0015563 A1 * | 1/2013 | Lee ...................... | H01Q 9/0414 257/659 |
| 2013/0183903 A1 * | 7/2013 | McCormack ........... | H01L 23/66 455/41.2 |
| 2014/0152509 A1 * | 6/2014 | Liu ........................ | H01L 24/19 427/58 |

(Continued)

FOREIGN PATENT DOCUMENTS

| | | |
|---|---|---|
| CN | 109244642 A | 1/2019 |
| CN | 109449141 A | 3/2019 |

*Primary Examiner* — Dameon E Levi
*Assistant Examiner* — Anh N Ho
(74) *Attorney, Agent, or Firm* — Slater Matsil, LLP

(57) ABSTRACT

An electronic device includes an electronic chip assembled on a first region of a substrate of the electronic device, a first coating layer of a first coating material covering a surface of the electronic chip facing away from the substrate, and a radiation element of an antenna of the electronic device separated from the substrate by at least a portion of the first coating layer and being offset with respect to the first region of the substrate so that the radiation element does not cover the electronic chip. The radiation element is buried in the first coating layer or is arranged in the first coating layer and partly covered with a protection material.

23 Claims, 7 Drawing Sheets

(56)                   References Cited

U.S. PATENT DOCUMENTS

| 2019/0057944 | A1* | 2/2019 | So ........................ H01Q 9/0407 |
| 2020/0035625 | A1 | 1/2020 | Wang et al. |
| 2020/0135669 | A1 | 4/2020 | Liang et al. |
| 2020/0381811 | A1* | 12/2020 | Yeh .......................... H01Q 1/38 |
| 2020/0381833 | A1* | 12/2020 | Gianesello ............ H01Q 21/28 |
| 2021/0036405 | A1 | 2/2021 | Han et al. |
| 2023/0318165 | A1* | 10/2023 | Coffy ................... H01L 23/585 |
| | | | 257/787 |

* cited by examiner

ELECTRONIC DEVICE

CROSS-REFERENCE TO RELATED APPLICATIONS

This application claims the priority benefit of French patent application number FR2202116, filed on Apr. 5, 2022, which is hereby incorporated by reference to the maximum extent allowable by law.

TECHNICAL FIELD

The present disclosure generally relates to electronic devices.

BACKGROUND

Electronic devices, particularly electronic devices for wireless communication at short distance, for example, of less than 50 m, may use patch-type antennas. A patch antenna is a planar antenna having a radiating element separated from a conductive reflective plane by a dielectric blade having its thickness depending on the wavelength of the desired communication signal.

Electronic devices with patch antennas may comprise an electronic chip configured to transmit and/or to receive signals via the patch antenna. However, existing solutions to integrate an electronic chip with a patch antenna are not sufficiently robust and/or have a significant thickness.

SUMMARY

Embodiments of the present disclosure generally relates to electronic devices and their manufacturing methods and, in particular examples, to wireless communication electronic devices.

Embodiments can improve current electronic devices as well as their manufacturing methods. Embodiments can also address the need to lower the thickness of electronic devices to allow their optimal integration.

An embodiment provides an electronic device comprising an electronic chip assembled on a first region of a substrate of the electronic device. A first layer of a first coating material covers at least one surface of the electronic chip facing away from the substrate. A radiation element of an antenna of the electronic device is separated from the substrate by at least a portion of the first coating layer and is offset with respect to the first region of the substrate so that the radiation element does not cover the electronic chip. The radiation element is buried in the first coating layer and/or in a second coating layer or is arranged in the first coating layer and at least partly covered with a protection material.

Another embodiment provides a method of manufacturing an electronic device comprising providing an electronic chip that is assembled on a first region of a substrate of the electronic device. A first layer of a first coating material is formed to cover at least a surface of the electronic chip facing away from the substrate. A radiation element is formed so that it is separated from the substrate by at least a portion of the first coating layer and offset with respect to the first region of the substrate to avoid covering the electronic chip. The radiation element is buried in the first coating layer or is arranged in the first coating layer and at least partly covered with a protection material.

According to an embodiment, the electronic chip is capable of exciting the radiation element with a communication signal.

According to an embodiment, the substrate comprises a ground layer supporting a conductive surface, coupled to ground, and provided with an opening. A signal layer is provided with at least one signal line and arranged opposite at least a portion of the opening of the ground layer. The radiation element is arranged opposite at least a portion of the opening of the ground layer, the ground layer being arranged between the signal layer and the radiation element.

According to an embodiment, the radiation element is totally buried in the first coating material.

According to an embodiment, the radiation element is electrically insulated from the substrate.

According to an embodiment, the radiation element is arranged in the first coating layer and at least partly covered with the protection material, and the protection material is different from the first coating material.

According to an embodiment, the radiation element is arranged in the first coating layer and at least partly covered with the protection material, and the protection material is identical to the first coating material.

According to an embodiment, the forming of the radiation element is preceded by an etch step where a surface of the first coating material, opposite to the substrate, is etched so that at the end of the etch step, a thickness of the first coating material measured between the substrate and the etched surface of the first coating material, is in the range from 100 micrometers to 1,000 micrometers.

According to an embodiment, the radiation element is obtained by a deposition of a conductive surface covering a portion of the surface of the first coating material obtained after the etch step.

According to an embodiment, a trimming step is applied to the conductive surface so that, at the end of the trimming step, at least one surface extension dimension of the conductive surface is smaller than before the trimming step.

According to an embodiment, after the trimming step, a finishing step is carried out so that an additional layer of material, for example, the first coating material or the protection material, is formed to at least cover the conductive surface.

According to an embodiment, during a thickness decrease step, the additional layer of material is etched so that the additional layer of the coating material covers the conductive surface with a thickness in the range from 1 micrometer to 36 micrometers.

According to an embodiment, the etch step is configured so that a recessed box is obtained in the first coating material, the box having a lateral extension equal, or approximately equal, to the desired lateral extension of the conductive surface.

According to an embodiment, the etch step is configured so that, at the end of the etch step, the roughness of the etched surface of the first coating material is smaller than 1 micrometer.

Another embodiment provides an electronic system comprising a first electronic device such as defined hereabove and a second electronic device such as defined hereabove, the two electronic devices being configured to exchange a communication signal via their respective radiation element.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which:

FIG. 1 is a cross-section view showing an electronic device according to an embodiment of the present disclosure;

DETAILED DESCRIPTION OF ILLUSTRATIVE EMBODIMENTS

Figure 2:
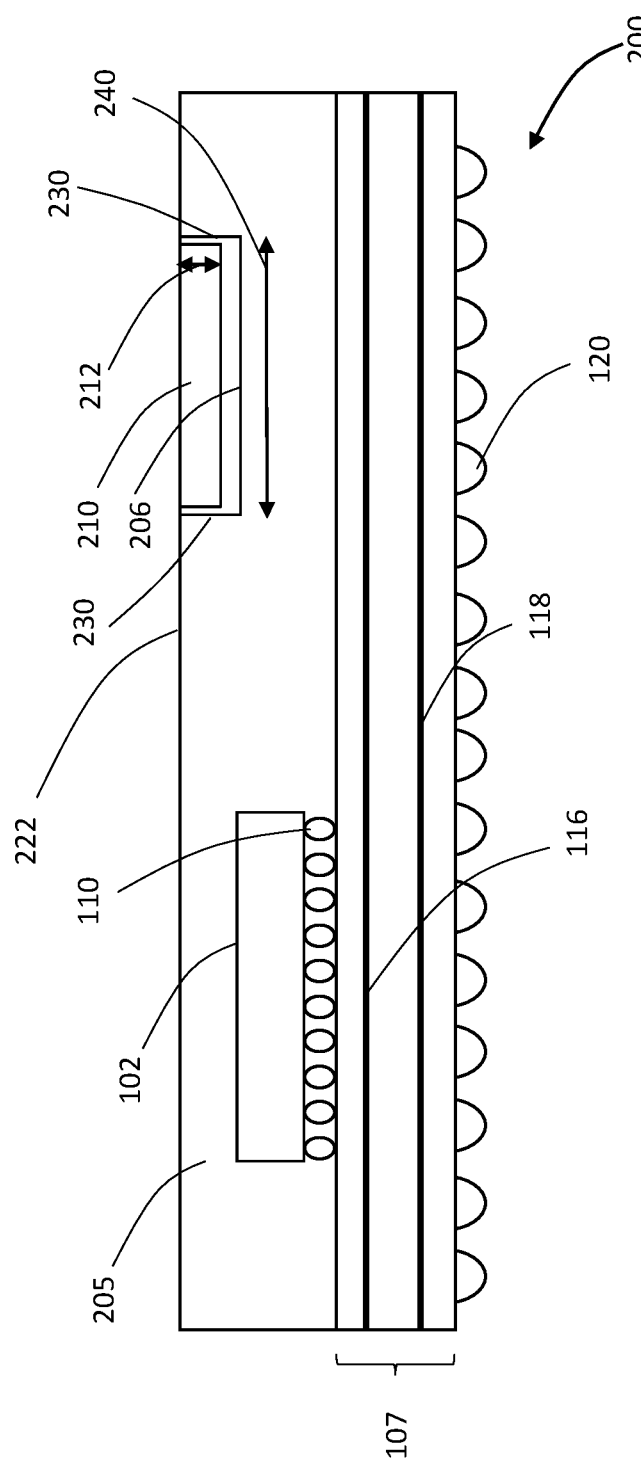
FIG. 2 is a cross-section view showing an electronic device according to another embodiment of the present disclosure.

Like features have been designated by like references in the various figures. In particular, the structural and/or functional features that are common among the various embodiments may have the same references and may disclose identical structural, dimensional, and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front," "rear," "top," "bottom," "left," "right," etc., or relative positions, such as terms "above," "under," "upper," "lower," etc., or to terms qualifying directions, such as terms "horizontal", "vertical", etc., it is referred to the orientation of the drawings or to an electronic device in a normal position of use.

Unless specified otherwise, the expressions "around," "approximately," "substantially" and "in the order of" signify within 10%, and preferably within 5%.

Figure 1:
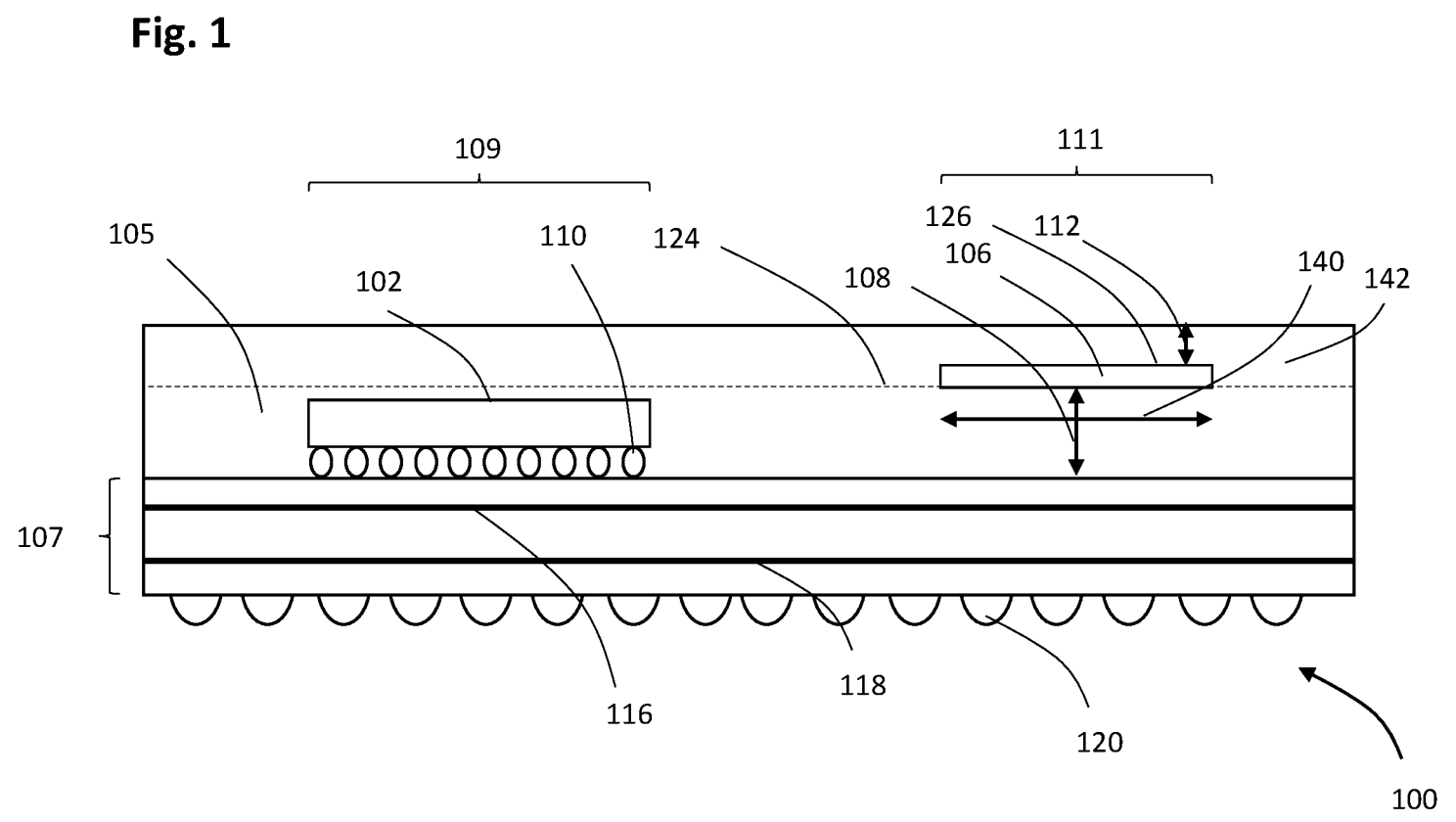

FIG. 1 schematically shows a cross-section view of an electronic device 100 according to an embodiment of the present disclosure.

The electronic device of FIG. 1 comprises an electronic chip (e.g., integrated circuit) 102 capable of exciting a radiation element 106 of an antenna of the electronic device with a communication signal. The excitation of the radiation element is, for example, configured to generate a radio frequency communication signal from radiation element 106.

Electronic chip 102 comprises, for example, contact pads 110, for example, in the form of balls. The contact pads are, in another example, flat. The contact pads are, for example, all arranged on a same surface of the electronic chip or distributed over a plurality of surfaces. In an example, the electronic chip is a flip chip.

Electronic chip 102 is assembled on a first region of a substrate 107 of electronic device 100. Electronic chip 102 is coupled, for example, via contact pads no, to substrate 107 or to conductive tracks of substrate 107 and/or to components of substrate 107.

Substrate 107, for example, comprises a ground layer 116 supporting a conductive surface, coupled to ground, and for example, provided with an opening (not illustrated).

The substrate, for example, comprises a conductive signal layer 118 provided, for example, with at least one signal line (not illustrated) and arranged in front of at least a portion of the opening of ground layer 116. The terms "in front of" mean that at least a portion of the signal line(s) is aligned, or approximately aligned, vertically with respect to the opening of the ground layer. Ground layer 116 and signal layer 118 are, for example, offset with respect to each other across the substrate thickness by being separated by an insulator. In an example, an insulator further separates the ground layer from a surface of the substrate. Electric contacts are coupled to the contact pads 110 of electronic chip 102. Substrate 107, for example, comprises contact pads 120, for example, in the form of balls. Contact pads 120 are, for example, used to couple and/or to bond substrate 107 to another substrate, not illustrated. Contact pads 120 are, for example, coupled to the ground layer or to the signal layer or to the contact pads of electronic circuit 102.

A layer 105 of a first coating material, for example, covers at least a surface of electronic chip 102 oriented opposite to the substrate. This enables to protect the electronic chip against possible outside elements such as humidity or electric shocks.

In an example, the first coating material is deposited and then it is cured by compression or thermocompression. The first coating material is, for example, epoxy resin.

Layer 105 is, for example, also arranged between radiation element 106 and substrate 107.

Radiation element 106 is, for example, arranged at the level of a region 111 offset with respect to a region 109 of the substrate having electronic chip 102 mounted thereon so that the radiation element does not cover the electronic chip. This enables electronic device 100 to be relatively thin.

The distance 108 between radiation element 106 and substrate 107 is, for example, in the range from 100 micrometers to 1,000 micrometers. For a radio frequency signal of millimeter wave type, this distance is in the order of 275 micrometers. In an example, distance 108 is greater than the thickness of electronic chip 102. This enables not to damage the chip on manufacturing of layer 105, and also to limit interferences or the attenuation of the signal generated by the radiation element.

At the level of interface 124 with radiation element 106, the roughness of the surface of the layer 105 of the first coating material is, for example, smaller than 1 micrometer. This enables for the radiation element to be formed with accuracy, which, for example, improves the antenna performance of the device.

Radiation element 106, for example, has an extension 140 counted in a horizontal plane, equal or approximately equal to 1 mm by 1 mm and a thickness in the order of one micrometer or of a few tens of micrometers.

Radiation element 106 is covered, for example, by an additional layer 142 of the first coating material, so that radiation element 106 is buried in the first coating material, and protected by this first coating material. As a variant, additional layer 142 is of made a second coating material different from the first coating material. Additional layer 142, for example, covers an upper surface 126 of radiation element 106 across a thickness 112 in the range, for example, from 1 to 36 micrometers, and in certain cases from 4 to 20 micrometers, for example, in the order of 20 micrometers. The thickness of layer 142 covering radiation element 106 will be selected, for example, to avoid too strongly disturbing the antenna radiation of radiation element 106 and to ensure a protection against outside elements such as humidity or mechanical shocks.

Radiation element 106 interacts with the communication signal from electronic chip 102 to transmit a radio frequency signal. Similarly, the radiation element may, for example, receive a radiofrequency signal coming from the outside, towards the electronic chip, such as, for example, a signal originating from an electronic device identical to that of FIG. 1.

Radiation element 106, in the example where a ground layer is present in the substrate, interacts therewith so that, for example, an antenna signal is formed and transmitted towards the outside of the device.

In the example where a signal line surface is present, electronic chip 102 delivers, for example, a signal to be transmitted to the line or to the lines of the signal line surface 118. Radiation element 106 interacts with the ground layer and with the line surface of signal 118 so that, for example, an antenna signal is formed and transmitted towards the outside of the device.

In another example, only radiation element 106 is present and substrate 107 comprises no ground layer and no signal line surface. In this case, radiation element 106 is coupled to a conductive line of substrate 107 which is in connection with electronic chip 102. A transmission signal is, for example, sent by electronic chip 102 to the conductive track of the substrate through contact pads no, after which the signal is taken to radiation element 106, for example, over a via arranged between substrate 107 and radiation element 106. Such a via (not illustrated) is, for example, formed by laser direct structuring (LDS) or corresponds to a through mold via (TMV) in first coating material 105.

Although, in the example of FIG. 1, electronic chip 102 is coupled to substrate 107 via contact pads no, in other embodiments it will be possible for other connection types to be present as a variant or additionally, such as wire bondings.

FIG. 2 schematically shows a cross-section view of an electronic device 200 according to another embodiment of the present disclosure. In the example of FIG. 2, electronic chip 102 and substrate 107 are similar to those of FIG. 1. In the example of FIG. 2, radiation element 106 is replaced with a radiation element 206 having a portion, for example, planar or approximately planar, arranged in a layer 205 formed, for example, of the first coating material. This means, for example, that a lower surface of radiation element 206 facing substrate 107, as well as at least four lateral sides 230 of this lower surface, are in contact with the first coating material of layer 205. The lateral extension 240 of radiation element 206, counted in a horizontal plane is, for example, in the order of one millimeter. In the example of FIG. 2, radiation element 206 comprises raised edges which start from the outer lateral edges of the radiation element to an upper surface 222 of the layer 205 of first coating material oriented opposite to substrate 107. In the example of the cross-section plane of FIG. 2, the radiation element 206 thus arranged has a "U" shape with the first coating material arranged outside of the "U" shape. Inside of the "U" shape is arranged a protection material 210 which is, in an example, the first coating material or, in another example, another type of material such as a material conventionally used for the filling of spaces under electronic chips (under-fill). The height 212 of the protection material is, for example, in the range from 1 to 40 micrometers, and for example, in the order of 20 micrometers.

In the example of FIG. 2, electronic chip 102 and radiation element 206 are positioned similarly to electronic chip 102 and the radiation element 106 of FIG. 1.

FIGS. 3A-3G show simplified cross-section views of a method of manufacturing the electronic device 100 of FIG. 1 according to an embodiment of the present disclosure.

FIG. 3A shows, step 302, electronic chip 102 assembled on substrate 107.

FIG. 3B shows, step 304, a layer of first coating material deposited, for example, by compression, on the electronic chip as well as on the surface of the substrate having the chip assembled thereon.

FIG. 3C shows, step 306, the layer of the first coating material thinned, for example, by strip grinding, so that its thickness is decreased and so that the surface after thinning 124, for example, has a roughness smaller than 1 micrometer.

FIG. 3D shows, step 308, a radiation layer 307 formed on a portion of the surface obtained at the end of step 306 with the purpose of becoming the radiation element. In an example, this portion does not cover the electronic chip and has a lateral extension 309 greater than the final lateral extension of the radiation element. The forming of the radiation layer may be performed by any method known by those skilled in the art such as, for example, a vacuum deposition, a plasma-enhanced deposition, an evaporation, or also electrodeposition. Radiation layer 307 is made, for example, of a conductive material such as a metal.

FIG. 3E shows, step 310, a laser trimming (or laser etching) is performed to etch the ends of radiation layer 307. The lateral extension 140 obtained after trimming is smaller than lateral extension 309. The fact of trimming radiation layer 307 after deposition enables to accurately align radiation element 106. The etching of the end of radiation element 106 generates, for example, a possible local overetching 311 at the ends of the radiation element.

FIG. 3F shows, step 312, another layer 315, for example, made of the same first coating material formed, for example, by the molding technique, above the surface of the first coating material obtained at the end of step 310 to also cover radiation element 106 with a thickness 313.

FIG. 3G shows, step 314, layer 315 decreased in thickness, for example, by etching or polishing or grinding to form layer 142. The resulting thickness corresponds to thickness 112 of FIG. 1.

FIGS. 4A-4E show a method of manufacturing the electronic device 200 of FIG. 2 according to another embodiment of the present disclosure. The first three steps of the example of FIG. 4A are similar to the steps 302, 304, and 306 of FIGS. 3A-3C.

FIG. 4B shows, step 408, a well 230 formed from surface 124 in offset fashion with respect to the electronic chip.

FIG. 4C shows, step 410, radiation element 206 formed in well 230. At this step, and as according to the example of the cross-section of FIG. 4C, radiation element 206 takes the "U" shape and, for example, protrudes on each side outside of well 230.

FIG. 4D shows, step 412, protection material 210 formed in the "U" shape and, for example extends out of the "U" shape by a deposition method, for example, by drop casting or by doctor blade.

FIG. 4E shows, step 414, the surface opposite to the substrate thinned so that the protection material 210 extending outside as well as the material of the radiation element extending outside are removed while keeping a sufficient thickness of protection material above the radiation element. At this step, thickness 124 is, for example, decreased.

Figure 3:
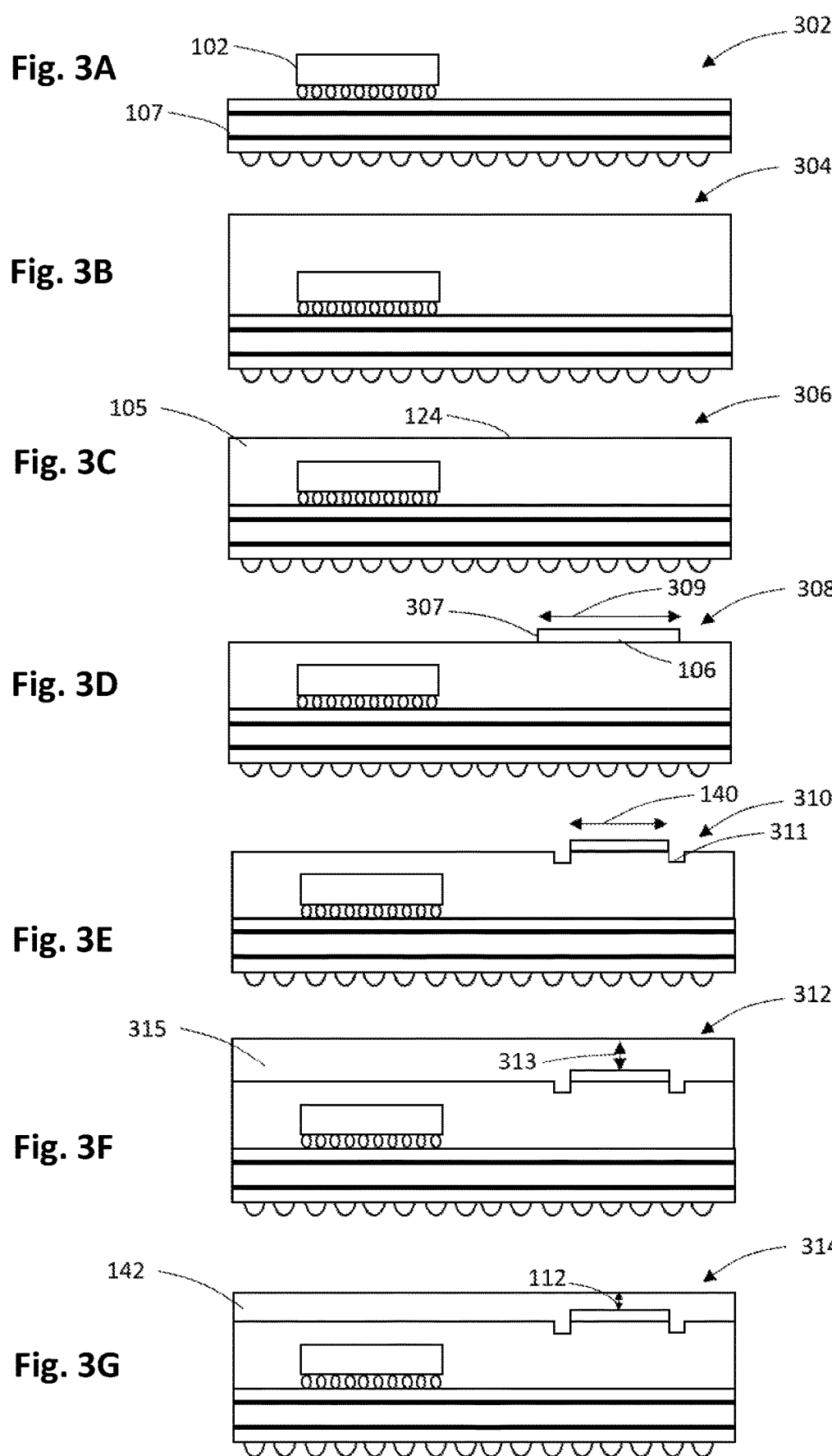
FIGS. 3A-3G (collectively FIG. 3) show a method of manufacturing the electronic device of FIG. 1 according to an embodiment of the present disclosure.
Figure 5:
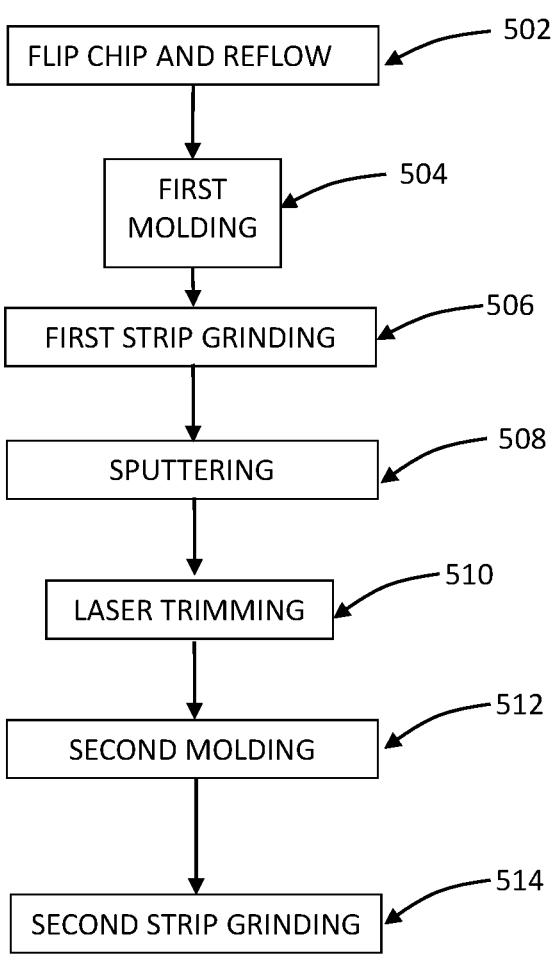
FIG. 5 shows the method of FIG. 3 in the form of blocks.

FIG. 5 shows the method of FIG. 3 in the form of blocks.

A step 502 (FLIP CHIP AND REFLOW) corresponds to step 302. At this step where the electronic chip is mounted on the substrate, a reflow phase is, for example, implemented to melt part of the contact pads of the electronic chip so that they establish a contact with tracks of substrate 107.

A step 504 (FIRST MOLDING) corresponds to step 304. A step 506 (FIRST STRIP GRINDING) corresponds to step 306. A step 508 (SPUTTERING) corresponds to step 308. A step 510 (LASER TRIMMING) corresponds to step 310. A step 512 (SECOND MOLDING) corresponds to step 312. A step 514 (SECOND STRIP GRINDING) corresponds to step 314.

Figure 4:
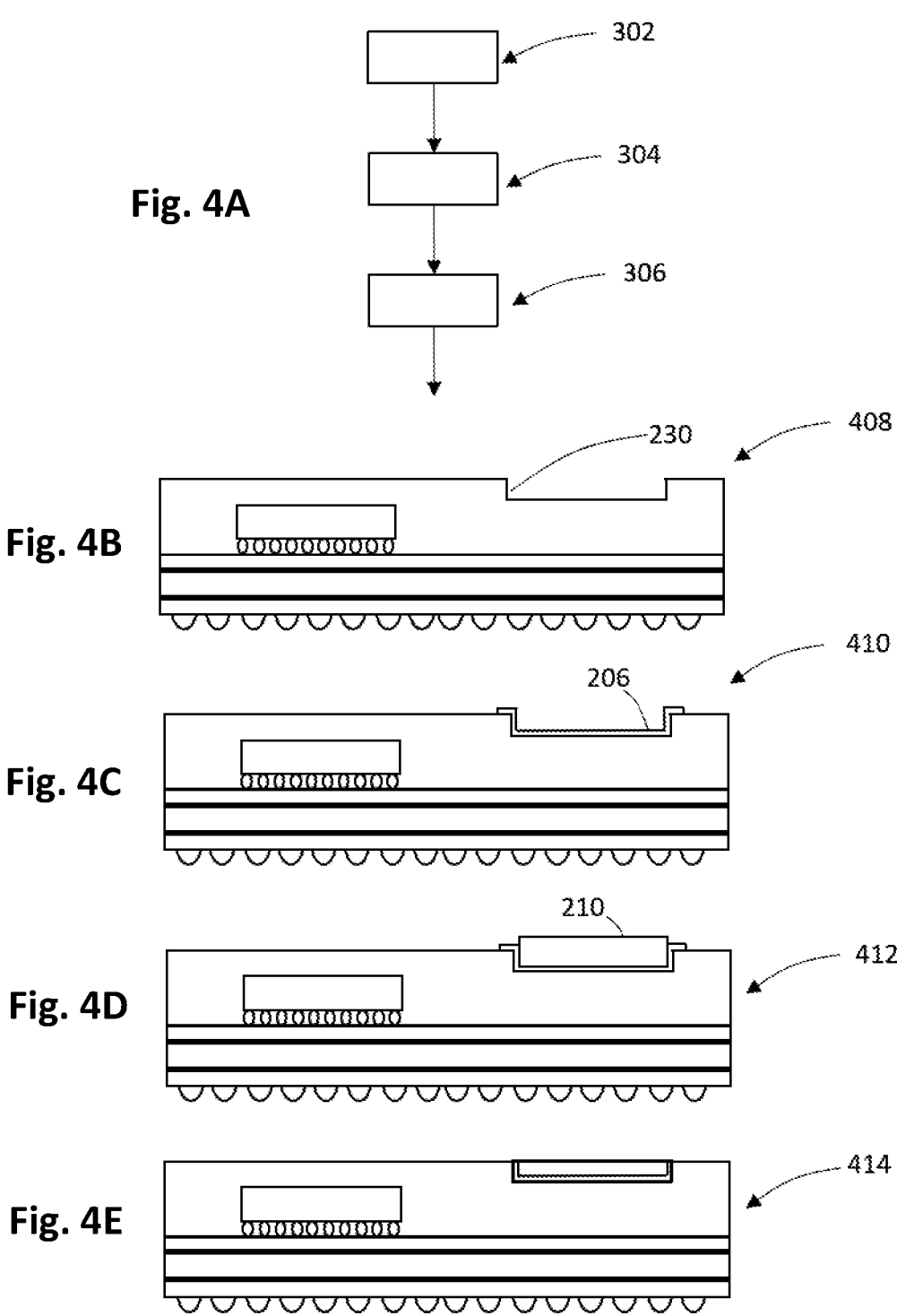
FIGS. 4A-4E (collectively FIG. 4) show a method of manufacturing the electronic device of FIG. 2 according to another embodiment of the present disclosure.
Figure 6:
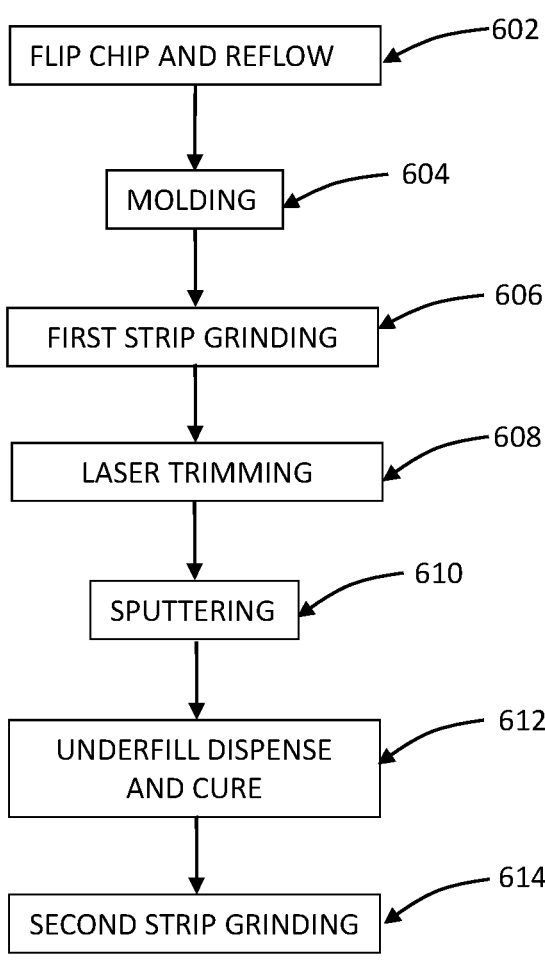
FIG. 6 shows the method of FIG. 4 in the form of blocks.

FIG. 6 shows the method of FIG. 4 in the form of blocks. A step 602 (FLIP CHIP AND REFLOW) corresponds to step 302. A step 604 (MOLDING) corresponds to step 304. A step 606 (FIRST STRIP GRINDING) corresponds to step 306. A step 608 (LASER TRIMMING) corresponds to step 408. A step 610 (SPUTTERING) corresponds to step 410. A step 612 (UNDERFILL DISPENSE AND CURE) corresponds to step 412. At this step, protection material 210 is, for example, the material currently used for the filling under the chips ("underfill") and is, for example, only dispensed within the "U" shape. Protection material 210 is then, for example, cured with a thermal and/or ultraviolet treatment. A step 614 (SECOND STRIP GRINDING) corresponds to step 414.

Figure 7A:
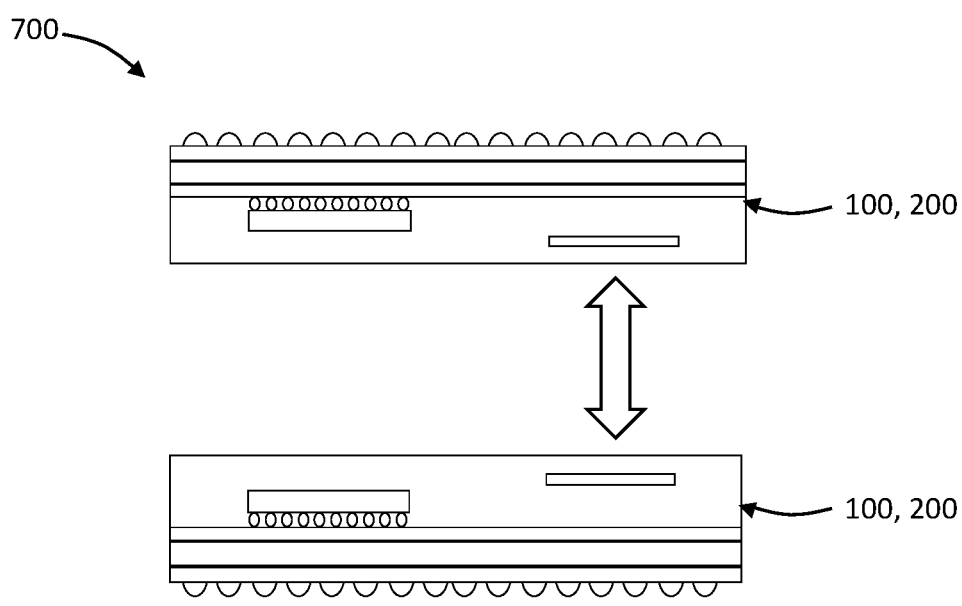
FIG. 7A shows an electronic system according to an embodiment of the present disclosure.
Figure 7B:
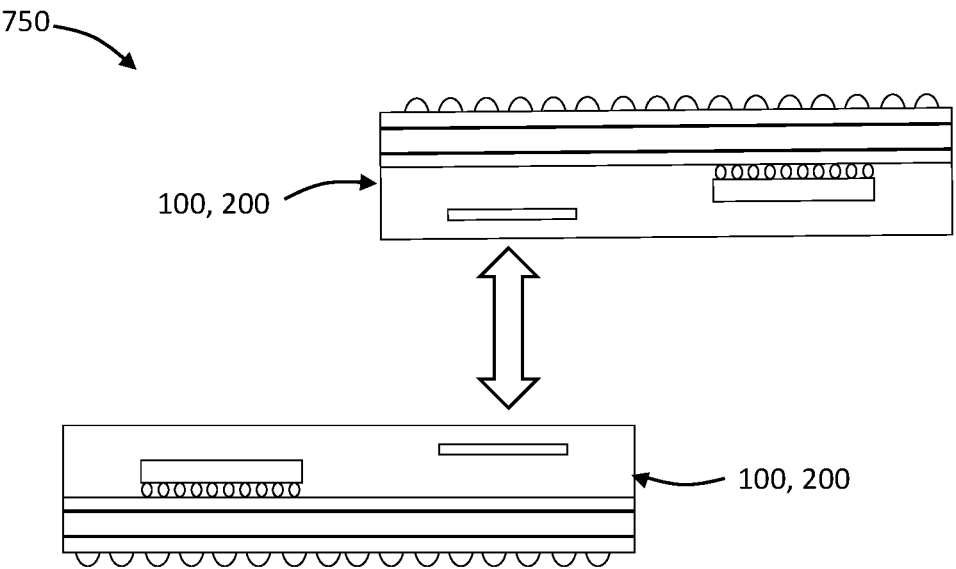
FIG. 7B shows an electronic system according to another embodiment of the present disclosure.

FIG. 7A shows an electronic system 700 according to an embodiment of the present disclosure and FIG. 7B shows an electronic system 750 according to an embodiment of the present disclosure. In the example of FIGS. 7A and 7B, electronic system 700, 750 comprises two electronic devices 100, 200 similar to those of the examples of FIGS. 1 and 2, devices 100 and 200 being arranged with respect to each other to be able to either receive or transmit a signal towards each other. The transmission or the reception of the signal is, for example, performed via their respective radiation element 106 or 206. One of the devices is, for example, flipped so that radiation elements 106, 206 are face to face and the signals between radiation elements 106 or 206 only cross the material of layer 142 or protection material 210.

In the example of FIG. 7A, radiation elements 106, 206 are positioned in each electronic device 100 or 200 so that, when radiation elements 106, 206 are face to face, the devices are vertically aligned, that is, their edges are substantially vertically aligned.

In the example of FIG. 7B, radiation elements 106 and 206 are positioned in each electronic device 100 or 200 in the same way so that, when radiation elements 106, 206 are face to face, one of the devices 100 or 200 is only partially in front of the other.

Various embodiments and variants have been described. Those skilled in the art will understand that certain features of these various embodiments and variants may be combined, and other variants will occur to those skilled in the art. In particular, layer 205 is, for example, formed by two stacked layers of the first coating material similarly to FIG. 1 for layers 105 and 142.

Finally, the practical implementation of the described embodiments and variations is within the abilities of those skilled in the art based on the functional indications given hereabove. In particular, concerning the protection material or the first coating material, which are selected among many materials adapted to being deposited, for example, by liquid deposition and then cured by heating or UV radiation or thermocompression and which provide, once cured, a protection against outside elements such as humidity.

What is claimed is:

1. An electronic device comprising:
an electronic chip assembled on a substrate in a first region of the electronic device;
a first coating layer of a first coating material covering at least one surface of the electronic chip facing away from the substrate; and
a radiation element of an antenna of the electronic device, the radiation element being arranged in the first coating layer in a second region of the electronic device offset from the first region so that the radiation element is separated from the substrate by at least a portion of the first coating layer and is offset from and does not overlap any portion of the electronic chip, wherein the radiation element comprises a central portion surrounded by raised outer edges, wherein the central portion of the radiation element is covered with a protection material.

2. The electronic device according to claim 1, wherein the electronic chip is configured to excite the radiation element with a communication signal.

3. The electronic device according to claim 1, wherein the substrate comprises:
a ground layer supporting a conductive surface and coupled to ground; and
a signal layer provided with at least one signal line, wherein the ground layer is arranged between the signal layer and the radiation element.

4. The electronic device according to claim 1, wherein the protection material is identical to the first coating material and wherein the radiation element is totally buried in the first coating material.

5. The electronic device according to claim 1, wherein the protection material is different from the first coating material.

6. The electronic device according to claim 1, wherein the protection material is identical to the first coating material.

7. The electronic device according to claim 1, wherein the radiation element is electrically insulated from the substrate.

8. The electronic device according to claim 1, wherein the protection material covers the radiation element with a thickness between 1 micrometer and 36 micrometers.

9. A method of manufacturing an electronic device comprising:
providing an electronic chip assembled on a substrate in a first region of the electronic device;
forming a first coating layer of a first coating material to cover at least a surface of the electronic chip facing away from the substrate;
forming a radiation element in the first coating layer in a second region of the electronic device offset from the first region so that the radiation element is separated from the substrate by at least a portion of the first coating layer and is offset from and does not overlap any portion of the electronic chip, wherein the radiation element comprises a central portion surrounded by raised outer edges; and
forming an additional layer of material in the central portion of the radiation element.

10. The method according to claim 9, further comprising etching a surface of the first coating material opposite to the substrate before forming the radiation element, the surface of the first coating material being etched so that a thickness of the first coating material measured between the substrate and the etched surface of the first coating material is between 100 micrometers and 1,000 micrometers.

11. The method according to claim 10, wherein forming the radiation element comprises depositing a conductive surface covering a portion of the surface of the first coating material obtained after the etching.

12. The method according to claim 11, further comprising, before forming the additional layer, trimming the conductive surface so that at least one surface extension dimension of the conductive surface is smaller.

13. The method according to claim 12, wherein forming the additional layer of material comprises depositing the additional layer of material to cover the conductive surface, wherein the additional layer of material comprises the first coating material or a protection material.

14. The method according to claim 13, further comprising etching the additional layer of material so that the additional layer of material covers the conductive surface with a thickness between 1 micrometer and 36 micrometers.

15. The method according to claim 11, wherein the etching comprises forming a recessed box in the first coating material, the recessed box having a lateral extension equal, or approximately equal, to a desired lateral extension of the conductive surface.

16. The method according to claim 10, wherein the etching comprises etching the surface of the first coating material so that a roughness of the etched surface of the first coating material is smaller than 1 micrometer.

17. An electronic system comprising:
a first electronic device comprising:
   a first electronic chip assembled on a first substrate in a first region of the first electronic device;
   a first coating layer of a first coating material covering at least one surface of the first electronic chip facing away from the first substrate; and
   a first radiation element of a first antenna of the first electronic device, the first radiation element being arranged in the first coating layer in a second region of the first electronic device offset from the first region of the first electronic device so that the first radiation element is separated from the first substrate by a portion of the first coating layer and is offset from and does not overlap any portion of the first electronic chip, wherein the first radiation element comprises a central portion surrounded by raised outer edges and wherein the central portion of the first radiation element is covered with a first protection material; and
a second electronic device comprising:
   a second electronic chip assembled on a second substrate in a first region of the second electronic device;
   a second coating layer of a second coating material covering at least one surface of the second electronic chip facing away from the second substrate; and
   a second radiation element of a second antenna of the second electronic device, the second radiation element being arranged in the second coating layer in a second region of the second electronic device offset from the first region of the second electronic device so that the second radiation element is separated from the second substrate by a portion of the second coating layer and is offset from and does not overlap any portion of the second electronic chip, wherein the second radiation element comprises a central portion surrounded by raised outer edges, wherein the central portion of the second radiation element is covered with a second protection material, and
wherein the first electronic device is configured to exchange a first communication signal via the first radiation element and the second electronic device is configured to exchange a second communication signal via the second radiation element.

18. The electronic system according to claim 17, wherein the first electronic chip is configured to excite the first radiation element with the first communication signal and the second electronic chip is configured to excite the second radiation element with the second communication signal.

19. The electronic system according to claim 17, wherein the first substrate comprises:
a first ground layer supporting a first conductive surface and coupled to ground; and
a first signal layer provided with at least one signal line, wherein the first ground layer is arranged between the first signal layer and the first radiation element; and
wherein the second substrate comprises:
a second ground layer supporting a second conductive surface and coupled to ground; and
a second signal layer provided with at least one signal line, wherein the second ground layer is arranged between the second signal layer and the second radiation element.

20. The electronic system according to claim 17, wherein the the first protection material is different from the first coating material.

21. The electronic system according to claim 17, wherein the second protection material is identical to the second coating material.

22. The electronic system according to claim 17, wherein the first radiation element is completely covered by the first protection material, wherein the first protection material is identical to the first coating material, wherein the second radiation element is completely covered by the second protection material, and wherein the second protection material is identical to the second coating material.

23. The electronic system according to claim 17, wherein the first protection material covers the first radiation element with a thickness between 1 micrometer and 36 micrometers and wherein the second protection material covers the second radiation element with a thickness between 1 micrometer and 36 micrometers.

* * * * *